United States Patent [19]
Lee et al.

[11] Patent Number: 5,862,144
[45] Date of Patent: Jan. 19, 1999

[54] METHOD FOR CORRECTING A HIGH FREQUENCY MEASUREMENT ERROR

[75] Inventors: Chang Seok Lee, Daejon-Shi; Ingab Hwang, Jeonjoo-Shi; Min Gun Kim, Daejon-Shi; Jae Jin Lee, Daejon-Shi; Kwang Eui Pyun, Daejon-Shi, all of Rep. of Korea

[73] Assignee: Electronics and Telecommunications Research Institute, Daejon-Shi, Rep. of Korea

[21] Appl. No.: 956,913

[22] Filed: Oct. 23, 1997

[30] Foreign Application Priority Data

Oct. 28, 1996 [KR] Rep. of Korea .................. 1996-49301

[51] Int. Cl.$^6$ .................................................. G06F 11/00
[52] U.S. Cl. ................................. 371/2.1; 371/30
[58] Field of Search ................................. 371/2.1, 30, 48, 371/47.1; 324/534, 646

[56] References Cited

U.S. PATENT DOCUMENTS 3,755,732 8/1973 Couper ..................................... 324/645

OTHER PUBLICATIONS

Freshet, L., Accuracy consideration in RF network measurements, 1988, (abstract only).

Primary Examiner—Phung M. Chung
Attorney, Agent, or Firm—Cohen, Pontani, Lieberman & Pavane

[57] ABSTRACT

A method for correcting a high frequency measurement error which can exactly correct the high frequency measurement error even with the use of a standard devices of which characteristic have not been verified by calculating the characteristic impedance of the correction device from the characteristics of an auxiliary measuring device calculated by using a general error correction method, and calculating again the once calculated characteristics of the auxiliary measuring device. The method in accordance with the present invention comprises the steps of modelling an auxiliary measuring device used for measuring a high frequency charateristics of the device under test by two transmission lines connected in series between two terminals and a parasitic component connected in parallel between a junction of the two transmission lines and a ground; and moving a reference measurement point to the junction of the two transmission lines by using a phase angle of each transmission line and calculating a reference impedance at the terminal of the auxiliary measuring device to which an object to be measured is connected by using the difference of the resultant reflection coefficients of each port.

3 Claims, 2 Drawing Sheets

METHOD FOR CORRECTING A HIGH FREQUENCY MEASUREMENT ERROR

BACKGROUND OF THE INVENTION

1. Field of the Invention

The present invention relates to a method for correcting a high frequency measurement error in measuring a high frequency characteristic of an object to be measured.

2. Description of the Related Art

In the conventional method of measuring a high frequency characteristic of an object to be measured, several standard devices are measured to calculate the characteristic of the auxiliary measuring device. Then, the effects of the auxiliary measuring device are eliminated from the characteristic of the object measured by using the auxiliary measuring device to calculate the characteristic of only the object to be measured. This method of correcting a high frequency measurement error is generally well known in the art. However, the conventional method has a drawback that only if a standard devices of which characteristic have been verified is used, the characteristic of the auxiliary measuring device can be exactly calculated, and the result that the characteristic of the object to be measured can be exactly calculated. When the characteristic of the auxiliary measuring device is calculated by using the conventional measurement error correction method, a terminal connected to a measurement system is normalized to a reference impedance of the measurement system; however a terminal connected to the object to be measured is normalized to a characteristic impedance of the standard devices used.

Therefore, the conventional method has problems that the characteristic impedance of the standard devices should be the same as the reference impedance of the measurement system to exactly perform a correction or the characteristic of the standard devices must be exactly known to allow for a correction even when the characteristic impedance of the standard devices are different from the reference impedance of the measurement system. In other words, in the conventional high frequency measurement method, it was possible to correct an error only if a verified standard devices are used, and measurement errors should be suffered because the characteristics of standard devices are often expected as they are made as is necessary.

SUMMARY OF THE INVENTION

It is therefore an object of the present invention to provide a method for correcting a high frequency measurement error which can exactly correct the high frequency measurement error even with the use of a standard devices of which characteristic have not been verified by calculating the characteristic impedance of the standard devices from the characteristics of an auxiliary measuring device calculated by using a general error correction method, and calculating again the once calculated characteristics of the auxiliary measuring device.

The present invention to achieve the afore-mentioned object is based on a finding that a auxiliary measuring device can be modelled by two transmission lines and a parasitic component which is connected to a junction between the two transmission lines in parallel therewith in view of the structure of the auxiliary measuring device. Therefore, if the characteristic of each transmission line is known, a reference measurement point can be moved to the same point. In this case, the input/output characteristics should be the same. If the input/output characteristics are not the same, this indicates that an error correction is wrong. The correction is performed again by using the difference. The characteristic of the transmission line to the side of which an object to be measured is connected can be known by the conventional method, and the characteristic of the transmission line to the side of which a measurement system is connected can be found by using the general characteristics of the transmission line as described herein.

If the characteristic impedance of the standard devices are obtained through the above process, the exact value can be found by calculating again the characteristics of the auxiliary measuring device once calculated.

A method in accordance with one aspect of the present invention comprises the steps of modelling an auxiliary measuring device by two transmission lines and a parasitic component connected to the junction between the two transmission lines, moving a reference measurement point by using transfer characteristics of the respective transmission lines, thus removing the effects of the two transmission lines, and calculating a characteristic impedance of a standard devices used in extracting the characteristic of the auxiliary measuring device from the difference of the reflection coefficients when two terminals are made to contact each other.

If the characteristic impedance of the standard devices calculated by the above method is utilized, the characteristic of the auxiliary measuring device can be exactly corrected even with the use of the standard devices which have not been verified.

BRIEF DESCRIPTION OF THE DRAWINGS

The present invention will become more apparent upon a detailed description of the preferred embodiments for carrying out the invention as rendered below. In the description to follow, references will be made to the accompanying drawings, where like reference numerals are used to identify like or similar elements in the various drawings and in which.

DETAILED DESCRIPTION OF THE INVENTION

Figure 1A:
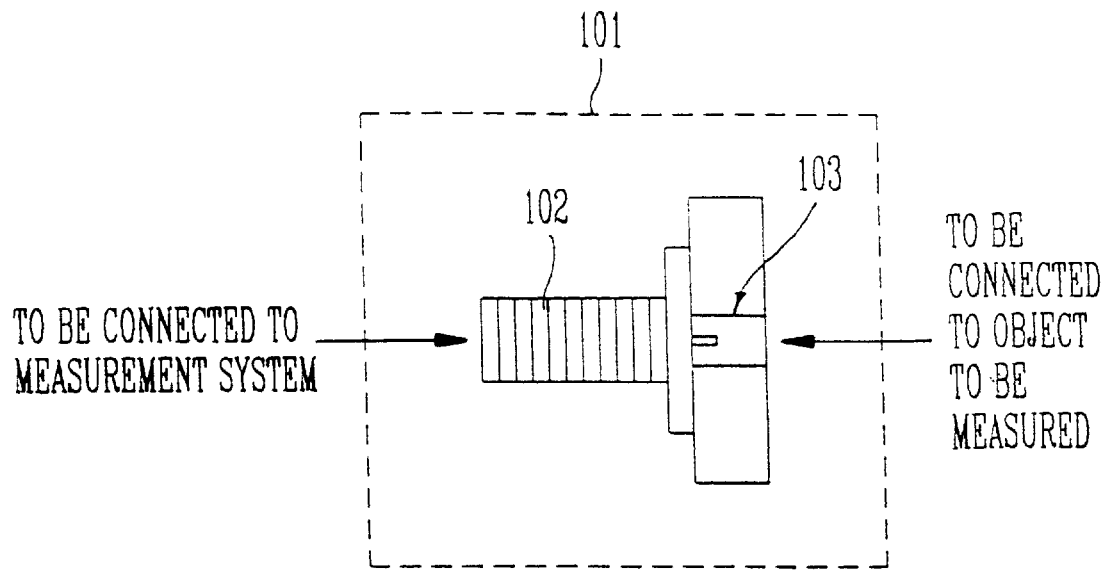
FIG. 1A shows one example of an auxiliary measuring device.
Figure 1B:
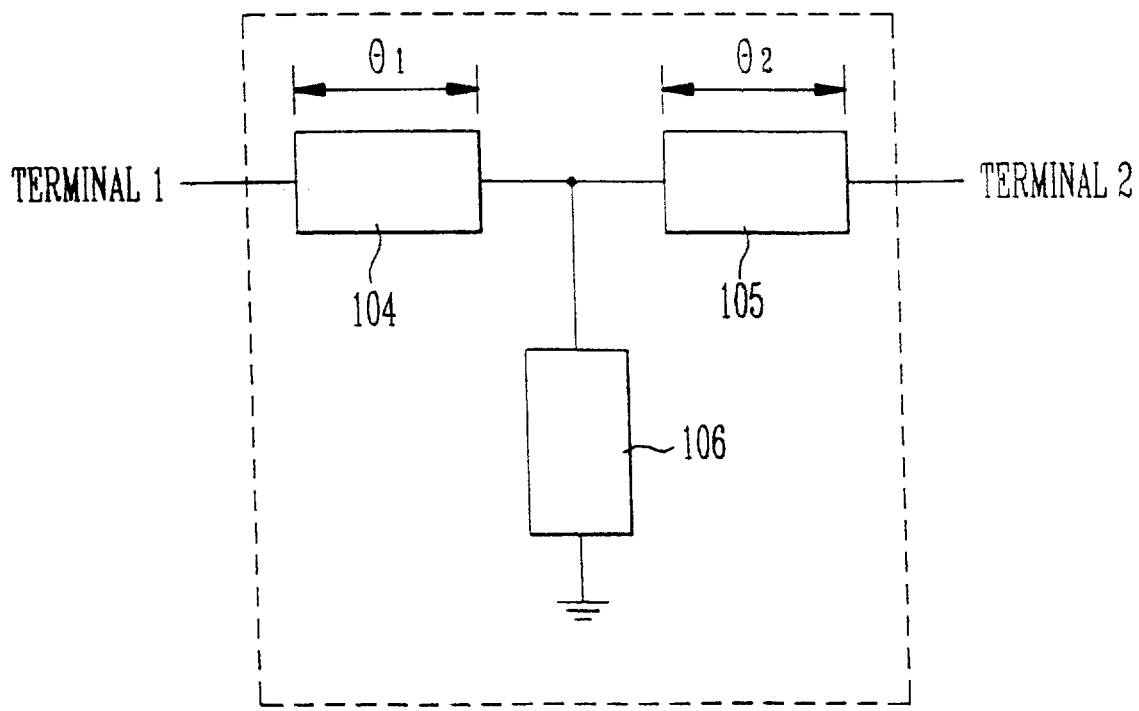
FIG. 1B shows an electrical equivalent circuit of an auxiliary measuring device shown in FIG. 1A.

Referring now to FIG. 1A and FIG. 1B, there is shown one example of an auxiliary measuring device 101, and an electrical equivalent circuit thereof. A connector 102, which is determined according to the configuration of a connector of a measurement system, is connected to the measurement system. The connector 102 can be modelled by a transmission line 104 of which phase angle is $\theta_1$. An auxiliary junction 103 of the shape adapted to the structure of an object to be measured is connected to the object. The auxiliary junction 103 can be modelled by a transmission line 105 of which phase angle is $\theta_2$. At the junction of each transmission line, there exists a parasitic component 106.

Figure 2:
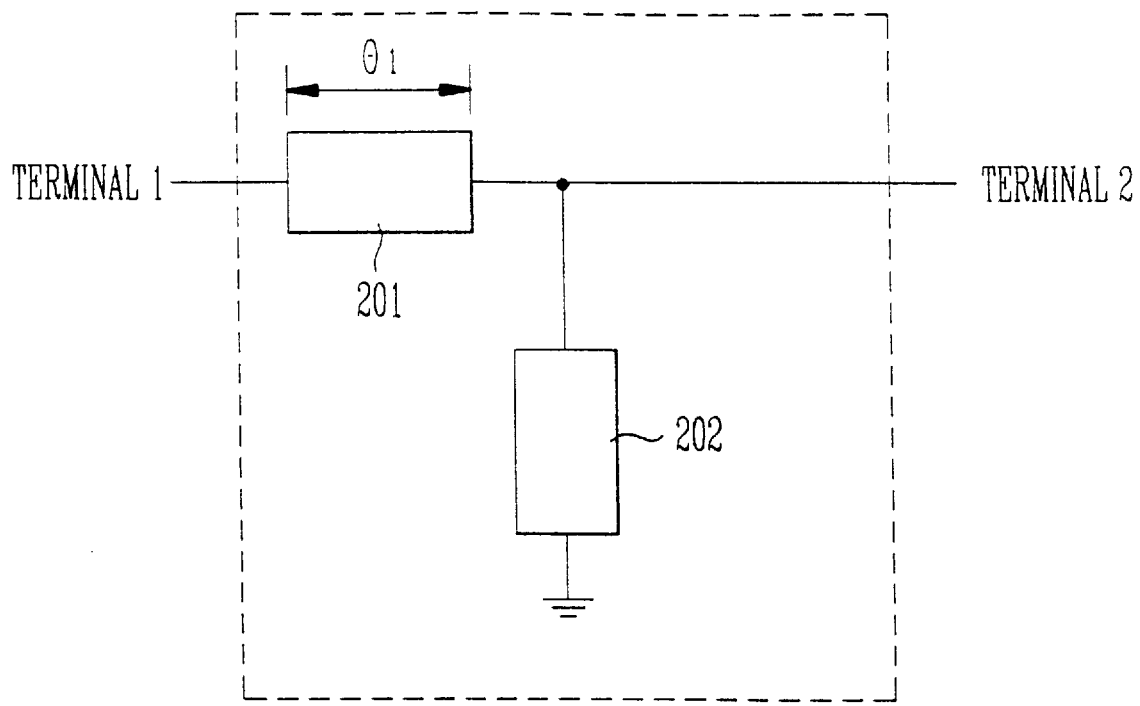
FIG. 2 shows a circuit including only a connector part in the side of the measurement system and a parasitic component.

If the conventional measurement error correction method is used, the scattering coefficient of the auxiliary measuring device and the phase angle $\theta_2$ of the transmission line 105 in the side of the object to be measured can be calculated. If this result and [Equation 1] below are utilized, a reference measurement point can be moved, and a scattering coefficient $S_{fij}$ with respect to a circuit including only a connector part 201 in the side of the measurement system and a parasitic component 202 as shown in FIG. 2 can be obtained. The above-referenced values may be calculated using Equation 1.

$$\begin{bmatrix} S_{f11} & S_{f12} \\ S_{f21} & S_{f22} \end{bmatrix} = \begin{bmatrix} S_{011} & S_{012}e^{j\theta_2} \\ S_{021}e^{j\theta_2} & S_{022}e^{j2\theta_2} \end{bmatrix} \quad [\text{Equation 1}]$$

where $S_{Oij}$ and $\theta_2$ are a scattering coefficient of the auxiliary measuring device as calculated by using a general high frequency error correction method, and a phase angle of the transmission line to which the object to be measured is connected, respectively.

If [Equation 2] below is utilized, an electrical phase angle $\theta_1$ of the transmission line 201 in the side of the measurement system can be calculated. By using [Equation 3] below, a scattering coefficient of a circuit including only a parasitic component 301 as shown in FIG. 3 can be calculated.

$$e^{-j2\theta_1} = \frac{S_{f21}S_{f12}}{1 + S_{f22}} - S_{f11} \quad [\text{Equation 2}]$$

$$\begin{bmatrix} S_{11} & S_{12} \\ S_{21} & S_{22} \end{bmatrix} = \begin{bmatrix} S_{f11}e^{j2\theta_1} & S_{f12}e^{j\theta_1} \\ S_{f21}e^{j\theta_1} & S_{f22} \end{bmatrix} \quad [\text{Equation 3}]$$

Figure 3:
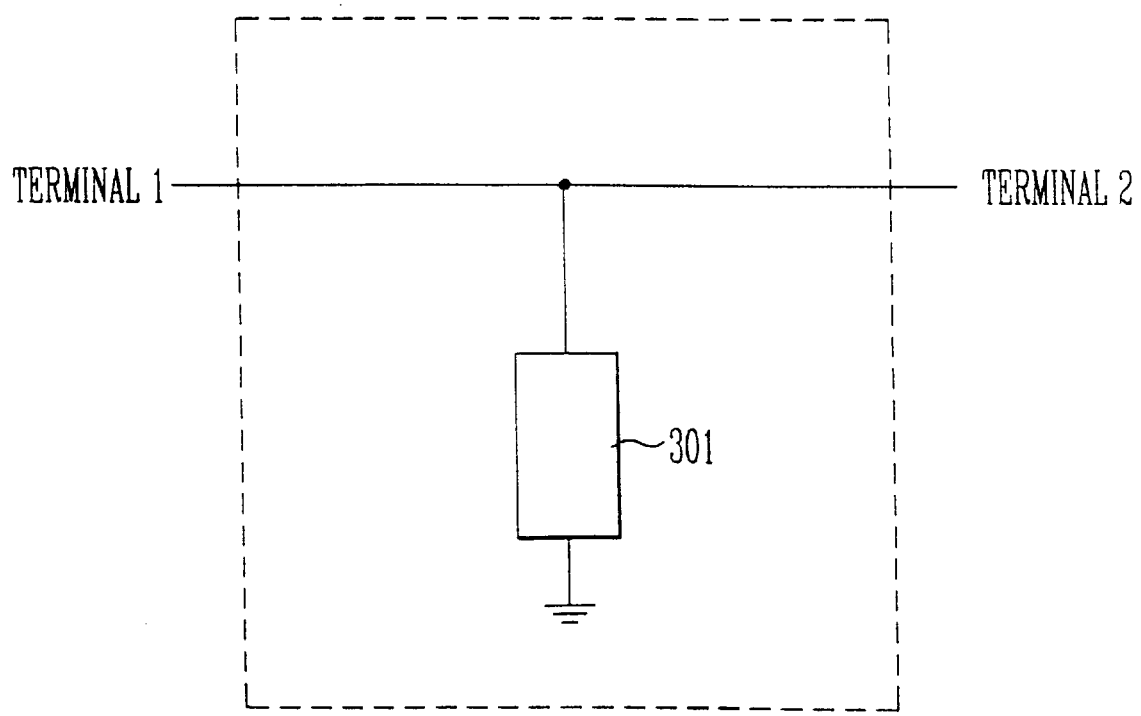
FIG. 3 shows a circuit including only a parasitic component.

In the circuit as shown in FIG. 3, a reference impedance $Z_L$ of the terminal to which the object to be measured is connected, i.e. Terminal 2 can be calculated by using [Equation 4] below.

$$Z_L = Z_S \frac{S_{11} + 1}{S_{22} + 1} \quad [\text{Equation 4}]$$

where $Z_S$ is a reference impedance of the measurement system.

If the reference impedance of the terminal to which the object to be measured is connected is used, the scattering coefficient of the auxiliary measuring device calculated by the general high frequency measurement error correction method can be converted into the scattering coefficient normalized to a reference impedance of the measurement system with respect to both terminals.

In accordance with the present invention, a high frequency measurement error can be corrected by using a standard devices which have not been verified. Thus, different correction devices can be made and used according to the types of auxiliary measuring devices as determined by the configuration of the object to be measured.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of correcting a high frequency measurement error associated with the high frequency measurement of an object by a measuring device, the object and measuring device each having a terminal connected thereto and having an interconnection device connected therebetween, said method comprising the steps of:

(a) modelling an auxiliary device for measuring a high frequency characteristic of the object wherein said auxiliary modelling device comprises first and second transmission lines having respective phase angles and having respective first ends serially connected to each other and forming an electrical junction thereat, said first and second transmission lines having respective second ends remote from said respective first ends defining respective terminals thereat, one of said terminals being configured for connection to the terminal on the object and the other one of said terminals being configured for connection to the terminal on the measuring device, said respective terminals defining respective reflection coefficients, said auxiliary modelling device further comprising a component having a first end connected to said electrical junction in parallel with said first and second transmission lines, said component having a second end connected to an electrical ground;

(b) setting a reference measurement point using said respective phase angles of said first and second transmission lines; and (c) calculating a reference impedance of the auxiliary modelling device at said terminal configured for connection to the object based upon a difference between said respective reflection coefficients.

2. The method of claim 1, wherein said step (b) further comprises the step of setting a reference measuring point at a point where said respective phase angles are approximately equal.

3. The method of claim 1, wherein said step (b) further comprises the steps of:

setting a first reference measurement point at said terminal at said second end of said first transmission line and obtaining a first reflection coefficient;

setting a second reference measurement point at said terminal at said second end of said second transmission line and obtaining a second reflection coefficient;

calculating said phase angle of said second transmission line by comparing said first and said second reflection coefficients.

* * * * *